United States Patent
Sercu et al.

(10) Patent No.: US 7,206,731 B2
(45) Date of Patent: Apr. 17, 2007

(54) ELECTROMAGNETIC/CIRCUIT CO-SIMULATION AND CO-OPTIMIZATION WITH PARAMETRIC LAYOUT COMPONENTS

(75) Inventors: Jeannick Sercu, Ghent (BE); Filip Demuynck, Ghent (BE); Hee-Soo Lee, Santa Rosa, CA (US); Shihab Al-Kuran, Green Bank, NJ (US); Samir Hammadi, Somerset, NJ (US); Chun-Wen Paul Huang, Edison, NJ (US)

(73) Assignee: Agilent Technologies, Inc., Santa Clara, CA (US)

( * ) Notice: Subject to any disclaimer, the term of this patent is extended or adjusted under 35 U.S.C. 154(b) by 760 days.

(21) Appl. No.: 10/452,820

(22) Filed: Jun. 2, 2003

(65) Prior Publication Data

US 2004/0243373 A1 Dec. 2, 2004

(51) Int. Cl.
*G06F 17/50* (2006.01)
*H05K 9/00* (2006.01)

(52) U.S. Cl. .............................. 703/14; 703/22; 716/4; 716/11; 716/12

(58) Field of Classification Search ................. 702/75; 703/14, 22, 11–12; 716/4
See application file for complete search history.

(56) References Cited

U.S. PATENT DOCUMENTS 6,181,754 B1 * 1/2001 Chen .......................... 375/350
6,604,225 B1 * 8/2003 Otsu et al. ...................... 716/3
6,834,380 B2 * 12/2004 Khazei ......................... 716/10

OTHER PUBLICATIONS

Sercu et al., "Electromagnetic/Circuit Co-Optimization of Lumped Component and Physical Layout Parameters using Generalized Layout components" 2002 IEEE p. 2073-2076.*
"CAD Benmark Rat-race mixer characterisation" (Oct. 2001) Microwave Engineering Europe, 2 pp.

* cited by examiner

*Primary Examiner*—Anthony Knight
*Assistant Examiner*—Thomas H. Stevens

(57) ABSTRACT

Simulation of electromagnetic characteristics of an electrical circuit uses netlist data defining component instances, including layout component instances, and their topological interconnection in an electrical circuit. A circuit simulation is performed using the netlist data, involving use of a model for each layout component instance. An attempt is made to retrieve an existing simulation model of the layout component instance from a database of such layout component simulation models. If no suitable simulation model can be found in the database, an attempt is made to interpolate a new simulation model from among existing simulation models in the database. If interpolation is determined not to be feasible, then an electromagnetic simulation of the layout component instance is performed to develop a new electromagnetic simulation model. This new model is used in the circuit simulation, and added to the database for future use.

6 Claims, 7 Drawing Sheets

ELECTROMAGNETIC/CIRCUIT CO-SIMULATION AND CO-OPTIMIZATION WITH PARAMETRIC LAYOUT COMPONENTS

TECHNICAL FIELD

This invention relates to electromagnetic/circuit co-simulation and co-optimization with parametric layout components.

BACKGROUND ART

Technological advances in wireless and wireline data communications have resulted in communications systems and integrated circuits that operate at very high RF, microwave and millimetre-wave frequencies. At these high frequencies the physical effects of metal interconnections between functional components play a major role in the electronic circuit performance. Accurate prediction of the circuit performance before fabrication, by means of electronic design automation (EDA) tools, has become essential for shortening design cycles and lowering engineering cost. Incorporating real-world physical effects in the early stages of the electronic design process is essential for achieving design success with very few design iterations. Yet design approaches in common use do not perform parasitic analysis and physical verification until after attaining the basic prescribed electrical design specifications. As a result, designers focus on getting their electrical designs to work in isolation from physical world effects. This division between electrical and physical design requires designers to exert much extra effort, going back and forth between schematic and layout design in search of the ultimate goal of meeting design specifications under real-world conditions.

In a typical high-frequency design procedure, several RF and microwave engineers work separately on different parts of an overall design, using the particular expertise of each contributing engineer. Although there are many benefits to this approach, it also introduces some challenges, especially between design implementation in the circuit domain (schematic) and physical domain (layout). Physical design parasitic effects must be incorporated in all high frequency design simulations. However, most engineers tend to stay close to the area of knowledge they know well (i.e. schematic circuits), and leave physical design verification to someone else, to be performed later in the design cycle. This delay in including key parasitic effects in the design process causes design flow bottlenecks, and often, redesign of the original circuit.

Some design groups tackle these issues by using various specific tools at certain design stages to provide them with an insight into the progress of their design efforts. One of those tools is electromagnetic simulation. Over the past decade, electromagnetic (EM) simulators have been widely applied for the verification of layout interconnections and passive components in RF and microwave circuit applications. Although EM simulators are very successful in providing accurate models for real-life physical effects, their adoption in the electronic design process has been hampered by some significant restrictions, the most important ones being the limited integration in the design framework, their limited performance in relation to the computer resources they require, and high level of expertise required for their effective use.

A major bottleneck in high-frequency design is the time spent transferring design data between independent design tools for EM analysis and verification. The typical process is to first assess the challenging areas of a design that would require further detailed analysis using an EM simulator. In most cases, each such area is captured manually into the EM tool, either by setting it up as a sub-network and exporting it to the EM tool, or manually regenerating the geometry in the EM tool itself. In another step, the EM generated results are manually back-annotated to the original circuit design via black-box representations, a process that is time consuming and cumbersome. This complicates design analysis, especially when several variations of the physical design effects are under study.

In general, most design bottlenecks occur when transferring the design between the schematic (for circuit performance analysis) and layout (for physical design modelling and verification) to obtain a successful integration of physical parasitics at the schematic level. Another problem is the prerequisite that the designer using the EM tool must have some understanding of the underlying modelling technology in order to be successful. EM tools require a level of modelling expertise that goes beyond classical circuit design. This EM expertise is not shared by all designers, creating the need for EM modelling experts within design groups. The level of expertise also dictates the efficiency of the process: the less experience a designer has in EM modelling, the longer it takes to perform and incorporate successful and accurate EM simulations in the design process.

When designing RF, microwave and millimetre-wave circuits, it is generally accepted that optimization using reasonable amounts of CPU-time should be based on circuit-oriented simulators. These simulators use the description of a circuit in terms of lumped elements and (coupled) transmission lines to account for distributed effects and/or directly rely on an S-parameter (or equivalently Y- or Z-parameter) description of the different parts of the circuit. The circuit simulator approach relies on subdividing the circuit into separate parts for each of which models exist or can be calculated (either (semi)-analytically or using a dedicated CAD-tool). Kirchoff's current and/or voltage laws are then applied to obtain the overall circuit equations and solutions. This approach is fast and therefore easily integrated with advanced optimization techniques. However, the partitioning and the circuit description do not always properly account for actual field effects and couplings that occur in the real-world circuit. To properly design microwave, RF and high-speed digital circuits it is necessary to take account of physical effects of the actual layout. It might seem preferable therefore to rely more heavily on electromagnetic simulators for circuit design and optimization purposes. However, although in the past decade much progress has been seen in the development of efficient field simulators, accompanied by a very large increase in computer speed and memory, field simulators remain slower relative to circuit simulators. This lack of speed is especially problematic for activities such as optimization, tuning and yield analysis that require a very large number of circuit evaluations. Secondly, EM simulators are best suited for the passive linear part of the circuit, and it is much more difficult to include active and non-linear elements which are more easily incorporated in circuit simulation.

Various commercial circuit design EDA environments offer EM/circuit co-simulation and co-optimization capabilities based on direct EM simulation technology. In this case the EM simulator is simply part of a classical circuit simulation or optimization loop and is directly driven by the circuit simulator. However, the speed of the simulation and optimization process critically depends upon the number of data samples to be evaluated and the time needed to solve the EM problem for each selected sample, and this can quickly become problematic. This makes existing solutions for EM/circuit co-optimization impractical for real-world electronic design work. For example, one supplier of such systems has stated "[the system] could have been configured to optimize using EM runs on each optimization step. While conceptually attractive, the long time required to optimize EM-nonlinear co-simulation is not practical for real-world design" ("The 2001 MEE CAD benchmark: Rat-Race Mixer Characterization", *Microwave Engineering Europe*, October 2001).

DISCLOSURE OF INVENTION

According to one aspect of this invention there is provided a method of simulating electromagnetic characteristics of an electrical circuit, comprising the steps of:

receiving netlist data defining component instances and their topological interconnection in an electrical circuit, said data including layout component instances; and performing a circuit simulation using said netlist data, and causing said circuit simulation to use a model for each said layout component instance by:

attempting to retrieve an existing simulation model of said layout component instance from a database of such layout component simulation models;

if no suitable simulation model can be found in the database, attempting to interpolate a new simulation model from among existing simulation models in the database; and if interpolation is determined not to be feasible, performing an electromagnetic simulation of said layout component instance to develop a new electromagnetic simulation model, using said new model in the circuit simulation, and adding said new model to the database for future use.

The invention facilitates more extensive use of EM simulation, for example in the characterisation and optimisation of layout interconnects to take proper account of parasitic effects, and at the same time helps to control the amount of CPU processing time that is required.

According to another aspect of this invention there is provided apparatus for simulating electromagnetic characteristics of an electrical circuit, comprising:

a store for receiving netlist data defining component instances and their topological interconnection in an electrical circuit, said data including layout component instances; and a circuit simulator for performing a circuit simulation using said netlist data, said circuit simulator having:

a database of layout component simulation models;

a capability of attempting to retrieve an existing simulation model of said layout component instance from said database;

a capability of attempting, if no suitable simulation model can be found in the database, to interpolate a new simulation model from among existing simulation models in the database; and a capability of performing, if interpolation is determined not to be feasible, an electromagnetic simulation of said layout component instance to develop a new electromagnetic simulation model, and thereafter using said new model in the circuit simulation and adding said new model to the database for future use.

BRIEF DESCRIPTION OF DRAWINGS

A method and apparatus in accordance with this invention, for simulating electromagnetic characteristics of an electrical circuit, will now be described, by way of example, with reference to the accompanying drawings, in which.

DETAILED DESCRIPTION

The invention provides a new concept of "parametric layout components" with an associated EM model database. Parametric layout components allow high-frequency circuit designers to incorporate physical design parasitics at the schematic design level. Once generated, the parametric layout components are available from a components library and are usable together with schematic components for concurrent EM/circuit co-simulation and co-optimization. With parametric layout components, high-frequency designers can start physical design analysis alongside analysis of the circuit's electrical performance, in the same schematic window. In other words, by including layout effects at the same time as electrical performance, designers can include real-world effects as they develop their circuits. This new concept goes beyond incremental design flow improvements, and introduces a new paradigm for tackling real-world physical design challenges.

Each parametric layout component has an associated EM model database that stores physical EM models generated for that parametric layout component. The physical EM model generator may be for example a built-in electromagnetic simulation engine in the circuit design system. Upon encountering a parametric layout component the circuit simulation engine checks its EM model database for the availability of the required model. If the model is unavailable, the EM engine is invoked to generate the model which is afterwards stored as part of the database. This approach provides an automated and user-friendly way to integrate EM simulations in a circuit design environment, preserving full flexibility to combine time domain (Transient) or frequency domain circuit analysis (DC, AC, Harmonic Balance, Envelope, ...) with EM-generated models. During the circuit optimization process both lumped component and physical layout parameters can vary simultaneously in order to tune the design and realize specified goals.

The process of generating parametric layout components involves, for example, importing layout artwork into the design environment using a standard translator (e.g. GDSII, DXF, or IGES) or entry by the user using primitive artwork shapes and/or existing layout components. Two types of parameters are added to complete the component definition: EM simulation control and physical layout parameters. The EM simulation control parameters determine the setup of the electromagnetic simulation during the EM model generation. They specify mesh settings and the frequency range for the S-parameter models. The physical layout parameters are captured by either defining a layout perturbation for the primitive artwork shapes associated with the parameter variation or by using one or more of existing layout component parameters as sub-network parameters. The layout parameter values can vary in a continuous way.

Figure 4:
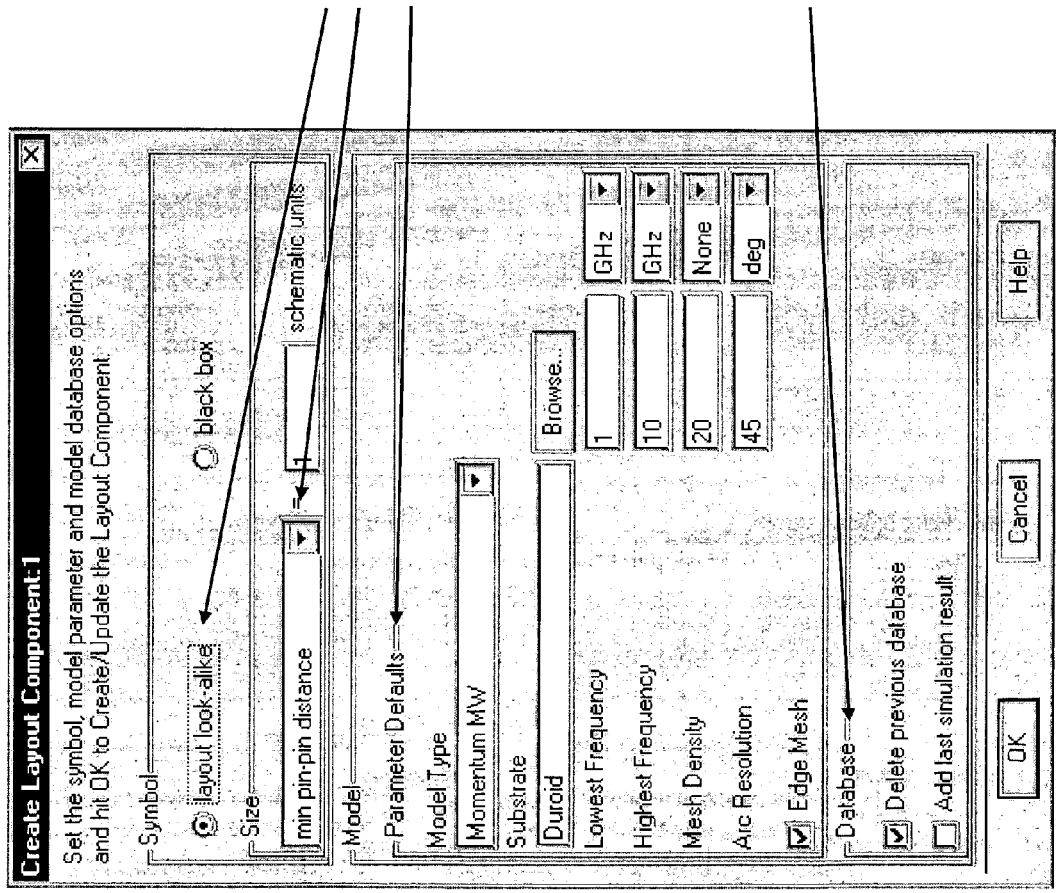
FIG. 4 shows a user-interface dialogue for defining EM simulation control parameters for a parametric layout component.

When the layout artwork is complete and the layout parameterization is defined, the parametric layout component is created using the known capability of circuit design environments to create custom components, according to settings specified by means of the user-interface dialogue shown in FIG. 4. This involves the definition of the layout look-alike schematic symbol size, the definition of the default EM simulation control values for the layout component and the initialization of its model database. The finished parametric layout component is stored in the component library of the design environment and can be readily incorporated in a schematic with other schematic elements, such as discrete elements, active devices or lumped elements. Once created, the parametric layout components can be modified to improve design performance just like any other schematic component and can be utilized in design optimization and real-time tuning exercises alone or with other layout and/or schematic components.

The schematic symbol for a parametric layout component is an automatically generated scaled copy of the layout artwork. It is layout look-alike in the sense that the actual layout artwork is used in combination with an appropriate scaling factor to draw the symbol. The layout look-alike symbol automatically maps the schematic pins of the symbol with the physical locations of layout ports, facilitating interconnection with lumped passive and active components in the schematic design. The ability to generate and use parametric layout components that actually look like their physical representation in a schematic makes their use more intuitive. This feature is advantageous when a number of parametric layout components are used together, with or without schematic components, in a single schematic window. For example, a schematic window might contain several parametric layout components in different sub-circuit parts. The layout look-alike associated with each symbol makes it easy to identify which sub-circuit it is referencing, without the need to read the part number or open up a sub-network representation.

Figure 1:
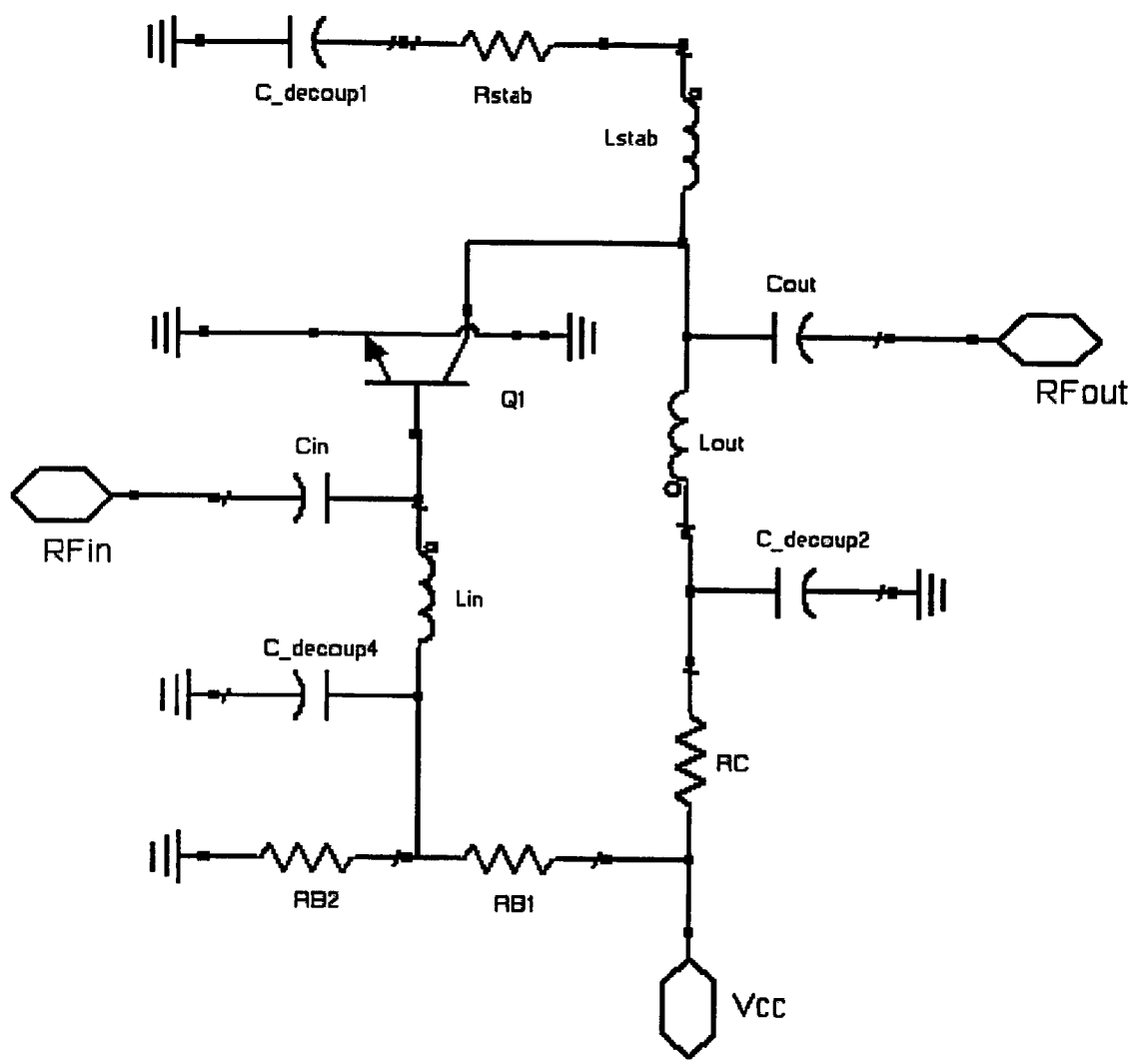
FIG. 1 shows an initial circuit schematic for a low-noise amplifier (LNA) the design of which is facilitated by use of the present invention.
Figure 2:
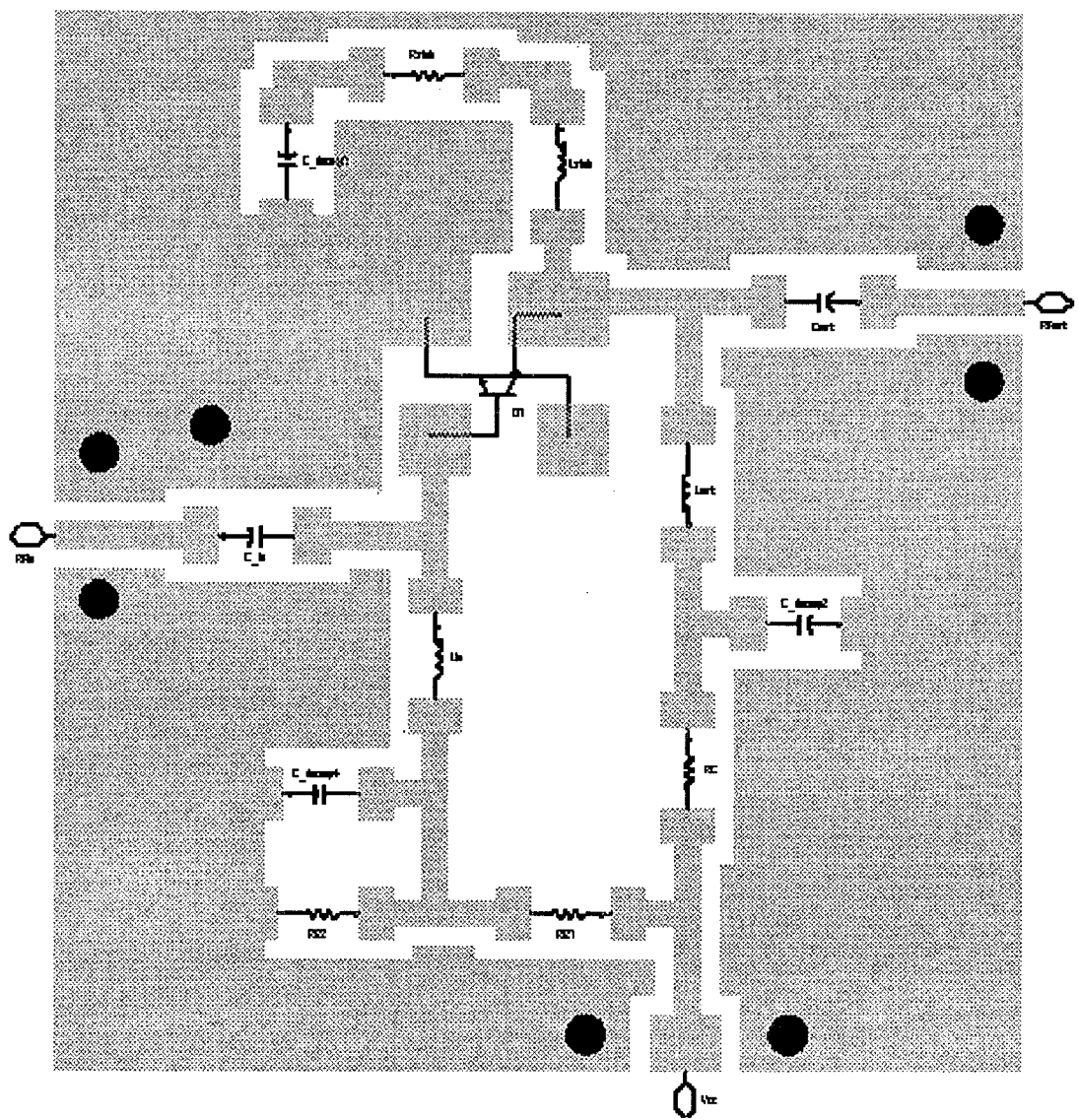
FIG. 2 shows an updated circuit schematic for the LNA of FIG. 1, including a parametric layout component for the passive metallization of the LNA.

The layout look-alike feature is especially helpful in the case of layout representations with a large number of ports. For example, FIG. 1 shows the initial circuit schematic for a low noise amplifier (LNA) design. FIG. 2 shows the updated circuit schematic including a parametric layout component created for the passive metallization of this LNA on a printed circuit board (PCB). The layout look-alike feature makes it very easy to determine which capacitor, inductor, diode, etc. connects to which part of the parametric layout component.

Another useful feature of the layout look-alike symbols is user-controllable size of the symbol. The value of symbol sizing is apparent when one considers these three possible scenarios:

1) Parametric layout component(s) encompassing schematic components—For this case, where a parametric layout component will have schematic components added to it (e.g. a PCB layout or a standard component package), users can define the minimum pin-to-pin spacing to equal the length of a standard schematic element. This allows the user to easily insert schematic components within the given parametric layout component.

2) Parametric layout component use only—For this second scenario, where parametric layout components are the sole building blocks of a circuit, the user can map the layout unit dimensions to scaled schematic unit dimensions. This allows the various parametric layout components used on a single schematic page to have realistic aspect ratios, while at the same time look reasonable in size relative to required schematic components (e.g. S-parameter simulation port). In other words, if the parametric layout component physical geometries are of the order of microns, then proper scaling is needed to make them visible next to standard schematic components' default size (e.g. 1-inch) used in the design environment.

3) Layout and schematic components in joint use—In this case, a mix of layout and schematic components are used alongside each other, and the user can size the parametric layout components to equal those of the schematic components. This facilitates organization of a mix of building blocks on the same schematic page.

Layout look-alike schematic symbols also facilitate the otherwise cumbersome process of back-annotating physical layout effects in the schematic circuit design.

Figure 5:
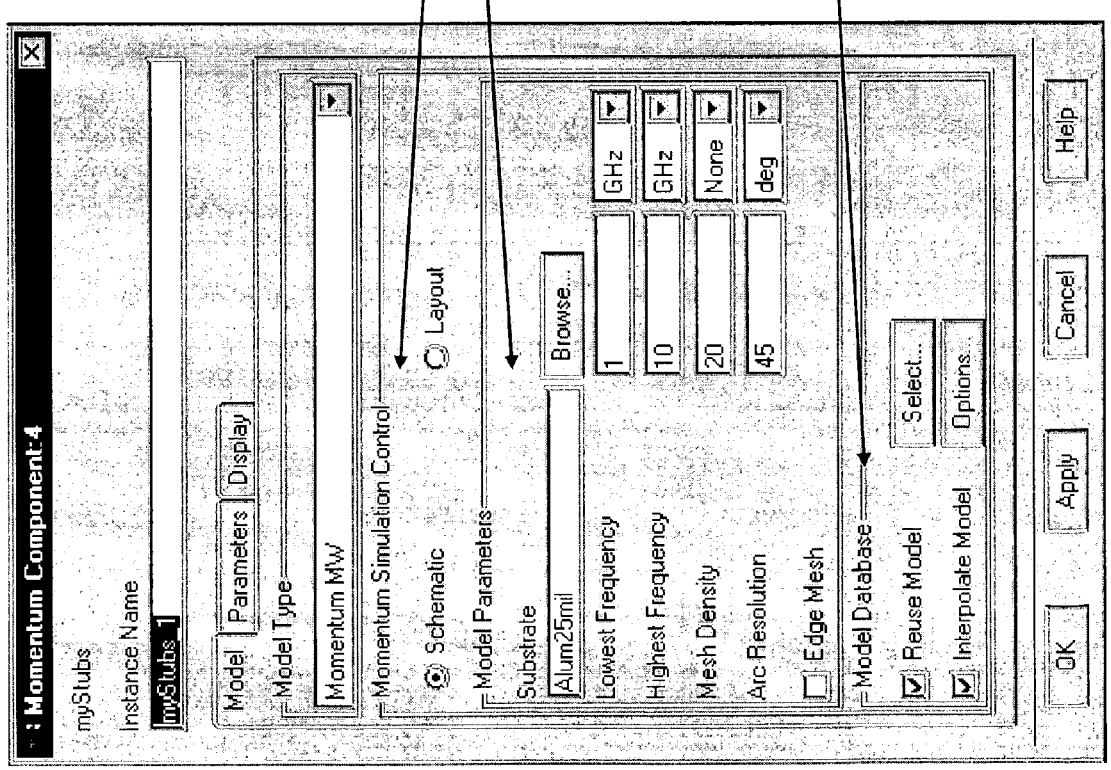
FIG. 5 shows a user-interface dialogue for setting or resetting EM simulation control values for a parametric layout component instance in a schematic design environment.

Once the parametric layout components are created and become accessible in a schematic design from the components library, users can control the layout modifications and the EM simulation options, e.g. from within a popup dialogue box as shown in FIG. 5. Designers can modify EM simulation controls (i.e. substrate information, frequency band, mesh settings), and also select the source of the electrical model behind the layout component (e.g. full-wave or quasi-static EM engine, or file-based). These steps contain the setup of the co-simulation (schematic/layout) process in the schematic window and eliminate the need to move portions of a design between schematic and layout environments, and avoid the need to change from a main design tool to access some independent EM tool.

Another feature of the parametric layout components is the associated EM model database that can store multiple models per given component, for different values of the layout parameters. This permits storage and reuse of EM simulation results. Each time a EM/circuit co-simulation is run, the EM model database for the parametric layout component is checked for availability of the model for the selected set of parameter values. If the model (for the specified parameters) is not available, the EM simulation is run. Also, a multi-dimensional interpolation facility is build into the EM model database to enable fast generation of new interpolated models from previously-calculated models, without the need for a new EM simulation. This feature is helpful in the context of optimization or tuning. It is possible to set up a parameter sweep to characterize the parametric layout component and fill its associated EM model database and subsequently use the EM model database interpolation during co-optimization or real-time tuning to explore and optimize the layout design variations without any new EM simulations. This is a major advantage over direct EM/circuit co-optimization technologies currently available, that need an EM simulation run for each optimization step or each set of parameter values chosen by the circuit optimizer.

Figure 3:
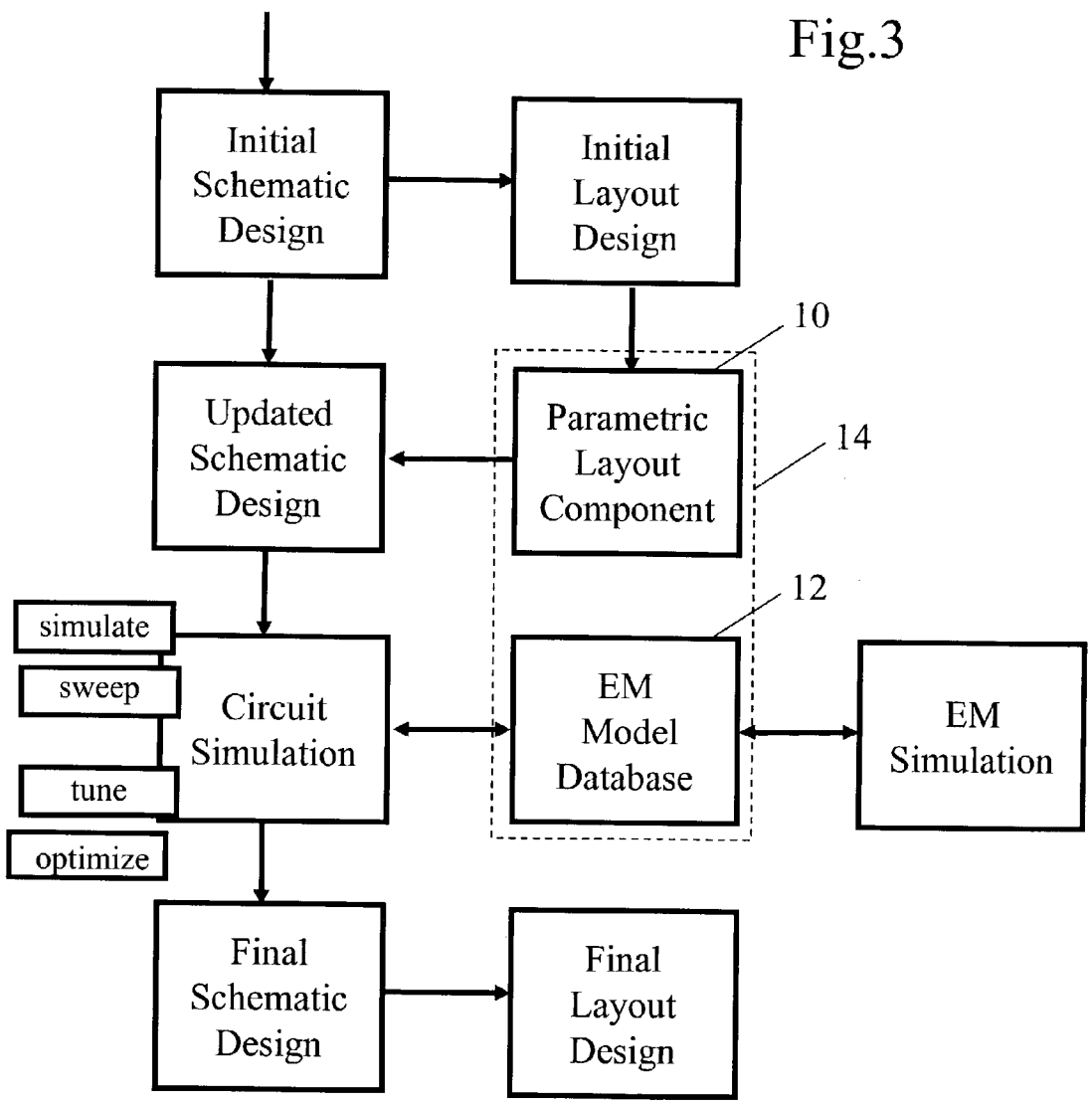
FIG. 3 is a block diagram showing principal functional blocks in a design process incorporating the present invention.

FIG. 3 is a block diagram showing the principal functional blocks in the EM/circuit co-simulation design process. The parametric layout component functionality 10 and the EM model database 12 are highlighted within the dashed rectangle 14.

The starting point is an initial schematic design (FIG. 1) for which an initial layout design (the shaded areas of FIG. 2) is created. A parametric layout component is created from the initial layout design and added to the schematic component library. This step involves:

the definition of layout parameters to capture the layout design modifications;

the definition of EM simulation control parameters;

the automatic creation of the layout look-alike schematic symbol; and the initialization of the EM Model Database.

The parametric layout component is created from a layout design built with primitive layout artwork shapes and/or layout components available in the layout design environment. The definition and use of artwork shapes and layout components to specify a more complex item is a known function of layout design environments and need not be described in further detail here. Two types of parameters are added to parameterize the component definition: EM simulation control and layout modification parameters. The EM simulation control parameters determine the setup of the EM simulation used to generate the EM S-parameter models for the parametric layout component. They specify the mesh settings and the frequency range for the EM models. An example of a user-interface dialogue for defining the EM simulation control parameters is shown in FIG. 4.

The layout modification parameters are captured by either defining a layout perturbation for the primitive artwork shapes associated with the parameter variation or by using one or more existing layout component parameters as sub-network parameters. The layout parameter values can vary in a continuous way and enable to user to control layout modifications from the schematic design environment.

Once created, the parametric layout component can be used in the schematic environment to update the initial schematic design, including the physical effects of the layout parasitics. As a next step, the performance of the updated schematic design including the parametric layout component can be analyzed by invoking the appropriate circuit simulation tools. Thus, the designer can run simulations, parameter sweeps, parameter tuning or optimize parameter values in combination with any type of available circuit analysis option (DC, AC, SP, Transient, Harmonic Balance, Envelope, . . . ) in order to meet the design specifications of the electrical design under real-world conditions and to obtain the best possible circuit performance.

In this process, the parameter values for the parametric layout components used in the schematic are treated in the same way as any other ordinary schematic component parameter. By selecting a parametric layout component instance in a schematic, for example, a parameter dialogue box can be opened. This dialogue allows the user to set or reset the layout parameter values and the EM simulation control values (see example in FIG. 5) to be used for the selected instance. When the circuit simulator is invoked these parameter values are included in the circuit netlist file that is parsed by the circuit simulator, and passed to the EM model database linked with each parametric layout component. The EM model database is dynamically linked into the circuit simulator and controls the EM simulation process. It keeps track of the generated EM S-parameter model samples for the parametric layout component. When the parametric layout component is simulated for the first time for any set of parameter values, the EM simulator is automatically invoked by the EM model database to generate the EM model for the parametric layout component. The resulting EM model is then stored in the EM model database for later reuse.

The use of parametric layout components in the circuit design enables engineers to verify and optimize circuit performance incorporating all high frequency physical effects. This leads to a physically verified and optimized final schematic design and a final layout design that, with high probability, works after fabrication at or close to the intended specification, without further elaborate and manual tuning.

Multi-dimensional EM model database interpolation As EM simulations in general tend to be very computer-time expensive when compared to circuit simulations, a multi-dimensional interpolation scheme with respect to layout parameters is implemented in the EM model database that enables fast generation of new models from previously calculated model samples, without the need for a new EM simulation. This EM model interpolation scheme is checked for possible use each time a new model sample is requested by the circuit simulator. The EM simulation is invoked only if the model (for the specified parameters) is not present and cannot be obtained by interpolation from existing nearby samples. The interpolation scheme is dynamic, in the sense that when insufficient nearby sample are available in the EM model database to enable an accurate interpolation, a minimum necessary number of additional samples are automatically selected to obtain an interpolated result. This auto-selection criterion minimizes the number of additional time-consuming EM simulations and avoids the generation of EM model samples for very small layout variations, thereby maximizing the reuse of data from the EM model database.

The EM model database is filled dynamically during the EM/circuit co-simulation process. Once enough model samples are calculated and stored in the database, all additional new samples can be retrieved using the interpolation scheme. This increases the efficiency of the co-simulation process without sacrificing the accuracy of the models. An additional advantage is that this multi-dimensional interpolation scheme enables quick extraction of gradient information, avoiding the numerical mesh noise from EM models generated for very closely spaced samples.

As an example of multi-dimensional interpolation, consider a parametric layout component with N layout parameters $(p_1, p_2, \ldots, p_N)$. Each set of parameter values represents a sample or point P in the N-dimensional parameter space. The S-parameter model S(P) generated by the EM simulator for each sample is stored in the EM model database. Next, consider a set of M+1 sample points $\{P^{(0)}, P^{(1)}, \ldots, P^{(M)}\}$ with 1 M N for which an S-parameter model has already been generated and stored in the EM model database. Provided that the set of M difference vectors $\{P^{(1)}-P^{(0)}, \ldots, P^{(M)}-P^{(0)}\}$ is linearly independent, they span an M-dimensional subspace in the N-dimensional parameter space. Hence, each point in the subspace can be uniquely represented as a linear combination by its subspace coordinates $(r_1, \ldots, r_M)$:

$$P = P^{(0)} + r_1(P^{(1)} - P^{(0)}) + \ldots + r_M(P^{(M)} - P^{(0)})$$

By introducing the extra coordinate $r_0$, this can be rewritten as:

$$P = \sum_{j=0}^{M} r_j P^{(j)} \quad (1)$$

with $$r_0 = 1 - \sum_{j=1}^{M} r_j \quad (2)$$

The S-parameter model in the new sample point P is obtained by the M-dimensional linear interpolation (3) below from the known S-parameter models in the sample points $P^{(j)}$.

$$S(P) = \sum_{j=0}^{M} r_j S(P^{(j)}) \quad (3)$$

Equation (3) provides a good approximation for the S-parameter model in the new sample point provided that:
the new sample P is located inside the basic cell built by the set of M difference vectors $\{P^{(1)}-P^{(0)}, \ldots, P^{(M)}-P^{(0)}\}$
the new sample P lies "close enough" to the M+1 sample points $\{P^{(0)}, P^{(1)}, \ldots, P^{(M)}\}$ The first condition translates to the requirement that all subspace coordinates must fulfil the relation:

$$0 \le r_j \le 1 \quad j=0,1,\ldots M \quad (4)$$

The second condition requires the introduction of a distance measure. One suitable measure is the normalized $L_1$-distance defined in (5) below, which can easily be calculated from the parameter values. The normalization for each parameter $p_k$ is with respect to the interpolation delta $\Delta p_k$. Default values for these interpolation delta's are automatically derived from the selected simulation control parameter values, although the user can overwrite these default values.

$$L_1(P, P^{(j)}) = \sum_{k=1}^{N} \left| \frac{p_k - p_k^{(j)}}{\Delta p_k} \right| \quad (5)$$

The new sample P is considered to be "close enough" or "neighbour" to the sample point $P^{(j)}$ if the normalized $L_1$-distance (5) is smaller than the number of parameters N.

Figure 6B:
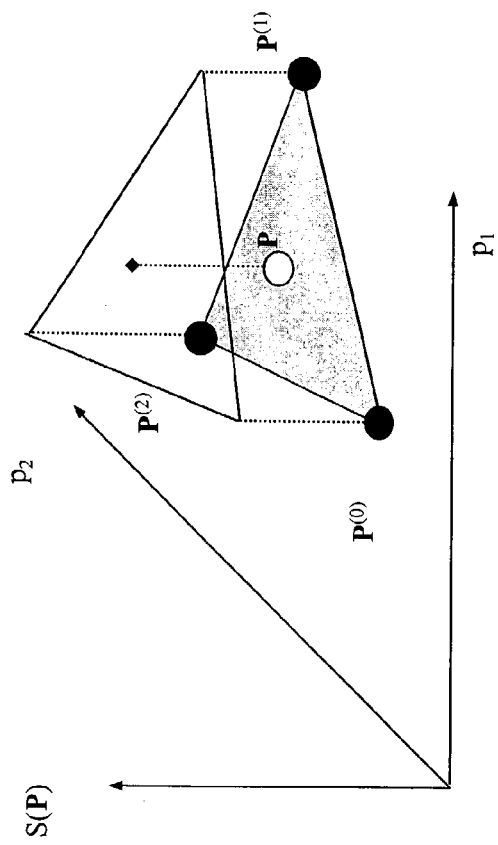
FIGS. 6A and 6B illustrate linear interpolation over a line segment and over a triangle respectively.

For a 2-dimensional parameter problem (N=2), the multi-dimensional linear interpolation defined in (3) above reduces to the well-known linear interpolation over a line segment for M=1 (see FIG. 6A) and to the linear interpolation over a triangle for M=2 (see FIG. 6B).

Figure 7:
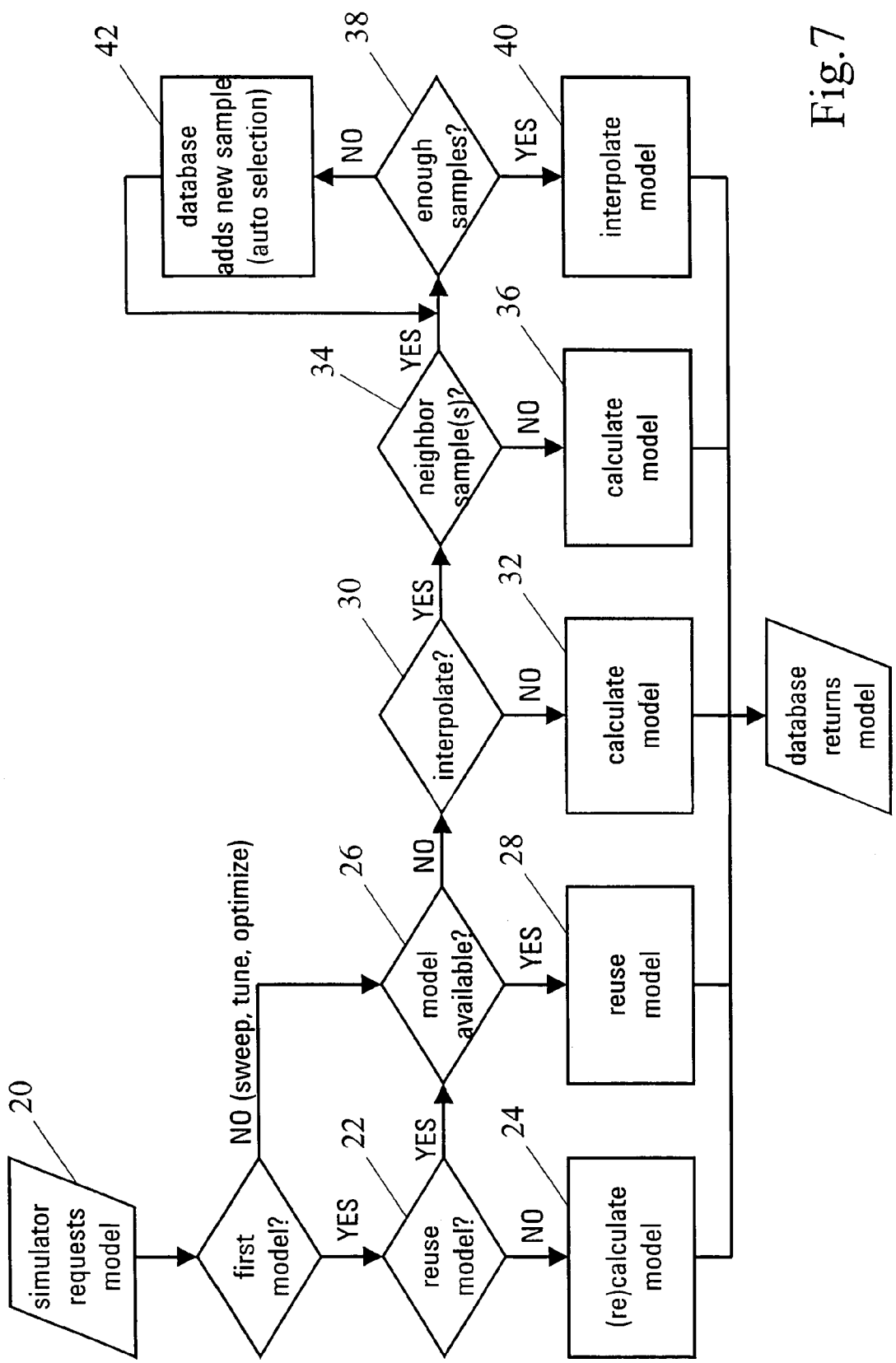
FIG. 7 is a flow diagram of an EM model generation and extraction process.

Model generation and extraction from the EM model database Each time the circuit simulator requests a model for a parametric layout component, the model generation and extraction process shown in FIG. 7 is invoked. In this process, the circuit designer has two control options: the "Reuse Model" and the "Interpolate Model" options, both of which can be set to YES or NO.

When an EM model for a new sample is requested by the circuit simulator (at step 20), the "Reuse Model" option set by the user is first checked at step 22. If this option is set to NO, the EM model database query is skipped and the EM simulator is directly invoked to generate the requested model at step 24. If the "Reuse Model" option is set to YES, the EM model database is queried at step 26 to look for the availability of the model sample. If the requested sample is already stored in the EM model database it is retrieved and reused, at step 28. If the model sample is new, the "Interpolate Model" option is checked at step 30, and if this option was disabled by the user, the EM simulator is invoked at step 32 to generate the requested model sample. However, if the "Interpolate Model" option is set to YES, the EM model database checks at step 34 whether the EM model for the new parameter values can be retrieved by multi-dimensional interpolation from existing (neighbouring) samples. In this process, care is taken to ensure that:

(1) the model samples used for interpolation are close enough to the new sample to ensure an accurate interpolation of the models;

(2) the order of the multi-dimensional interpolation is selected such that the number of new samples that require an EM model generation process is kept minimal; and (3) samples for which a new EM model is generated are not too close to existing samples, to eliminate numerical noise in the interpolated models.

The first requirement is taken care of by the user-selected interpolation delta's $\Delta p_k$, k=1, ..., N. The second requirement is included as the EM model generation process in general is a slow process as compared to the interpolation process. The final requirement guarantees that numerical discretisation noise present in the EM-derived models does not affect the accuracy of numerically derived gradients required for the optimization algorithms.

The interpolation scheme starts with the identification of all samples $P^{(j)}$ in the database with a normalized $L_1$-distance smaller than the number of parameters.

$$L_1(P, P^{(j)}) \le N \quad (6)$$

If no neighbour sample is found at an $L_1$-distance smaller than one, the model for the new sample is generated by invoking the EM simulator at step 36 and added to the EM model database. If one or more neighbour samples are found at step 38 satisfying (6) and at least one sample has a distance smaller than one, than the model for the new sample is retrieved by interpolation at step 40.

Figure 6A:
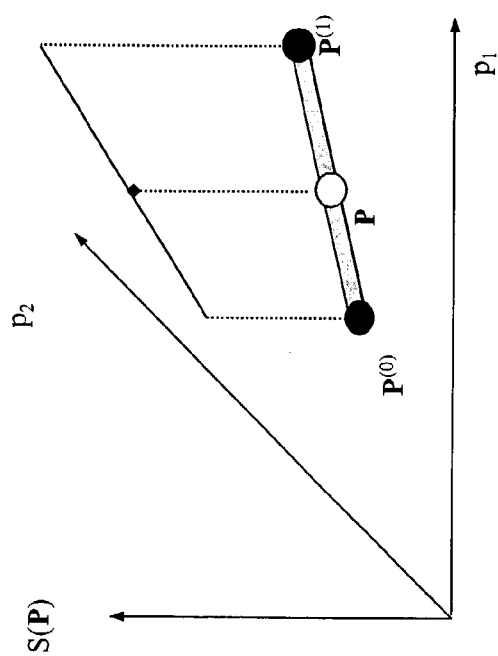

The first step in the interpolation scheme is to look for the minimal order M and M+1 linearly independent sample points that satisfy the condition (6) in conjunction with the requirement that the subspace coordinates for the new sample point are all positive and smaller than one. If such a set of sample points can be identified, the model for the new sample point is retrieved using the M-dimensional linear interpolation (3) from the known models in the sample points $P^{(j)}$. For a 2-dimensional parameter problem (N=2), interpolation over a line segment (M=1) is considered first prior to interpolation over a triangle (M=2) (FIGS. 6A and 6B).

If the minimal order M with M+1 sample points cannot be found in the model database, a minimal set of additional sample points is auto-selected and added to the EM model database, at step 42, prior to the interpolation. The order M is set equal to the minimal number of parameters for which the new sample P and an existing neighbour sample $P^{(k)}$ in the EM model database have different values. The set of indices for these parameters is denoted as $I=\{i_1, i_2, \ldots, i_M\}$.

The sample $P^{(k)}$ is the first sample needed for the interpolation. The M other samples are constructed as follows:

$$P^{(j)}=P^{(k)}\pm E^{(ij)}\Delta p_{ij}, j=1,\ldots,M \quad (7)$$

Here $E^{(ij)}$ is the unit sample that has all parameter values equal to zero except for parameter $p_{ij}$ whose value is one. The sign in (7) is chosen to be + or − such that the value of the parameter $p_{ij}$ for the new sample P lies between that of sample $P^{(k)}$ and $P^{(j)}$. All models for the new interpolation samples $P^{(j)}$ are first generated and added to the model database. After this, the model for the new sample P is retrieved using the M-dimensional linear interpolation scheme.

The invention claimed is:

1. A method of simulating electromagnetic characteristics of an electrical circuit, comprising the steps of:
   receiving netlist data defining component instances and their topological interconnection in an electrical circuit, said data including layout component instances; and
   performing a circuit simulation using said netlist data, and causing said circuit simulation to use a model for each said layout component instance by:
      attempting to retrieve an existing simulation model of said layout component instance from a database of such layout component simulation models;
      if no suitable simulation model can be found in the database, attempting to interpolate a new simulation model from among existing simulation models in the database; and
      if interpolation is determined not to be feasible, performing an electromagnetic simulation of said layout component instance to develop a new electromagnetic simulation model, using said new model in the circuit simulation, and adding said new model to the database for future use.

2. The method of claim 1, wherein the layout components include a layout interconnect.

3. The method of claim 1, wherein the interpolation of a new simulation model generates an S-parameter model in a new sample point P by M-dimensional linear interpolation from existing S-parameter simulation models in the database in sample points $P^{(j)}$ according to the interpolation $$S(P) = \sum_{j=0}^{M} r_j S(P^{(j)}).$$

4. Apparatus for simulating electromagnetic characteristics of an electrical circuit, comprising:
   a store for receiving netlist data defining component instances and their topological interconnection in an electrical circuit, said data including layout component instances; and
   a circuit simulator for performing a circuit simulation using said netlist data, said circuit simulator having:
      a database of layout component simulation models;
      a capability of attempting to retrieve an existing simulation model of said layout component instance from said database;
      a capability of attempting, if no suitable simulation model can be found in the database, to interpolate a new simulation model from among existing simulation models in the database; and
      a capability of performing, if interpolation is determined not to be feasible, an electromagnetic simulation of said layout component instance to develop a new electromagnetic simulation model, and thereafter using said new model in the circuit simulation and adding said new model to the database for future use.

5. The apparatus of claim 4, wherein the layout components include a layout interconnect.

6. The apparatus of claim 4, wherein the interpolation of a new simulation model generates an S-parameter model in a new sample point P by M-dimensional linear interpolation from existing S-parameter simulation models in the database in sample points $P^{(j)}$ according to the interpolation $$S(P) = \sum_{j=0}^{M} r_j S(P^{(j)}).$$

* * * * *

UNITED STATES PATENT AND TRADEMARK OFFICE
CERTIFICATE OF CORRECTION

PATENT NO. : 7,206,731 B2
APPLICATION NO. : 10/452820
DATED : April 17, 2007
INVENTOR(S) : Jeannick Sercu et al.

Page 1 of 1

It is certified that error appears in the above-identified patent and that said Letters Patent is hereby corrected as shown below:

| Column 9 | Formula (4) | $0\ r_j\ 1$ | -- | should be | $0 <= r_j <= 1$ |
| Column 10 | Formula (6) | $L_1(P, P^{(j)})\ N$ | -- | should be | $L_1(P, P^{(j)}) <= N$ |

Signed and Sealed this

Thirty-first Day of July, 2007

JON W. DUDAS
*Director of the United States Patent and Trademark Office*